US010530349B1

(12) United States Patent
Araragi (10) Patent No.: US 10,530,349 B1
(45) Date of Patent: Jan. 7, 2020

(54) SIGNAL TRANSMISSION DEVICE AND DRIVE DEVICE

(71) Applicant: DENSO CORPORATION, Kariya, Aichi-pref (JP)

(72) Inventor: Akifumi Araragi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/460,180

(22) Filed: Jul. 2, 2019

(30) Foreign Application Priority Data

Jul. 16, 2018 (JP) .................................. 2018-133788

(51) Int. Cl.
| | | |
|---|---|---|
| *H03K 5/153* | (2006.01) | |
| *H03K 5/15* | (2006.01) | |
| *H03K 3/017* | (2006.01) | |
| *H03K 7/08* | (2006.01) | |
| *H03K 5/151* | (2006.01) | |

(52) U.S. Cl.
CPC ............ *H03K 5/153* (2013.01); *H03K 3/017* (2013.01); *H03K 5/15006* (2013.01); *H03K 5/1515* (2013.01); *H03K 7/08* (2013.01)

(58) Field of Classification Search
CPC .. H03K 3/017; H03K 5/15006; H03K 5/1506; H03K 5/15066; H03K 5/1508; H03K 5/151; H03K 5/1515; H03K 5/153; H03K 7/08
See application file for complete search history.

(56) References Cited

U.S. PATENT DOCUMENTS

| | | | | |
|---|---|---|---|---|
| 7,847,639 B2* | 12/2010 | Yang | ........................ | H03K 7/08 327/175 |
| 9,128,498 B2* | 9/2015 | Shook | ........................ | G05F 1/10 |
| 9,621,040 B2* | 4/2017 | Mima | ..................... | H02M 3/156 |
| 2018/0019747 A1* | 1/2018 | Ikegawa | .................. | H02M 1/08 |

FOREIGN PATENT DOCUMENTS

JP    2007-006048 A    1/2007

OTHER PUBLICATIONS

Sanken Electric Co., Ltd. "SCM1200MF series". Datasheet, pp. 1-83, Oct. 13, 2017.

* cited by examiner

*Primary Examiner* — Patrick O Neill
(74) *Attorney, Agent, or Firm* — Oliff PLC (57) ABSTRACT

In a signal transmission device having a pulse generator, a RS F/F circuit and a detector, the generator generates a set pulse signal and/or a reset pulse signal when a state of a PWM signal is changed. After the generation of the set pulse signal, the generator continuously generates following pulse signals after elapse of a predetermined period of time counted from the generation of the set pulse signal. The generator adjusts, based on a selector signal, the predetermined period of time counted to a time when the following pulse signal is transmitted at a first time. The detector detects the state of the selector signal based on the predetermined period of time counted from a time when the RS F/F circuit receives the set pulse signal or the reset pulse signal to a time when receiving the following pulse signal at a first time.

11 Claims, 5 Drawing Sheets

SIGNAL TRANSMISSION DEVICE AND DRIVE DEVICE

CROSS-REFERENCE TO RELATED APPLICATION

This application is related to and claims priority from Japanese Patent Application No. 2018-133788 filed on Jul. 16, 2018, the contents of which are hereby incorporated by reference.

TECHNICAL FIELD

The present disclosure relates to signal transmission devices and drive devices equipped with a signal transmission device of driving semiconductor switches.

BACKGROUND

For example, a related art discloses a power semiconductor device equipped with power devices, a high voltage-side driver and a low voltage-side driver. Such a power device is composed of high voltage-side power devices and low voltage-side power devices connected in series. The high voltage-side driver drives the high voltage-side power devices, and the low voltage-side driver drives the low voltage-side power devices. The high voltage-side driver has a pulse generator. When the high voltage-side driver receives high voltage-side signals transmitted from an external electric control unit composed of a microcomputer, the pulse generator generates two types of signals, i.e. a turn-on signal and a turn-off signal in a pulse shape on the basis of the received high voltage-side signals (such as pulse width modulation signals (PWM signals).

When a gate terminal of each of level-shift transistors receives the turn-on signal and the turn-off signal transmitted from the pulse generator, a high voltage is supplied to a drain terminal of each of the level-shift transistors, and the drain terminal of each of the level-shift transistors is connected to a set-signal input terminal and a rest-signal input terminal of a flip-flop circuit through an inverter.

An output terminal of the flip-flop circuit is connected to a gate terminal of each of PMOS transistors and NMOS transistors as the high voltage-side drive elements. A drain terminal of each of the PMOS transistors and the NMOS transistors is connected to a gate terminal of the high voltage-side power device.

SUMMARY

The present disclosure provides a signal transmission device having a pulse generator, an output circuit and a detector. The pulse generator receives a first signal, generates and transmits at least a following pulse signal after elapse of a predetermined period of time counted from a time when a set pulse signal or a reset pulse signal is transmitted when the voltage level of the first signal is changed. The pulse generator receives a second signal which has a plurality of voltage levels, and changes, on the basis of the second signal, the predetermined period of time counted from the time when the set pulse signal or the reset pulse signal is transmitted to the time when the following pulse signal is transmitted at a first time. The detector detects the state of the second signal based on the predetermined period of time counted from a time when a first input terminal of the output circuit receives the set pulse signal to a time when the first input terminal receives the following pulse signal at a first time, or based on a period of time counted from a time when a second input terminal of the output circuit receives the reset pulse signal to a time when the second input terminal receives the following pulse signal at a first time.

Further, the present disclosure provides a drive device of driving a plurality of semiconductor switching elements. The drive device has a switch circuit, a plurality of drivers and the signal transmission device having the pulse generator, the output circuit and the detector.

The pulse generator generates and transmits at least a following pulse signal after elapse of the predetermined period of time counted from the time when the set pulse signal or the reset pulse signal is transmitted when the voltage level of the PWM signal is changed. The pulse generator receives a selector signal. The selector signal has a plurality of voltage levels corresponding to the plurality of semiconductor switching elements. The pulse generator changes, on the basis of a state of the selector signal, the predetermined period of time counted from the time when the set pulse signal or the reset pulse signal is transmitted to a time when the following pulse signal is transmitted at a first time. The detector detects the state of the selector signal based on the predetermined period of time counted from the time when the first input terminal receives the set pulse signal to the time when the first input terminal receives the following pulse signal at a first time, or based on a period of time counted from the time when the second input terminal receives the reset pulse signal to the time when the second input terminal receives the following pulse signal at a first time. The detector instructs, based on a detection result thereof, the switch circuit to connect the output terminal of the output circuit to one of the plurality of drivers so as to drive one of the plurality of semiconductor switching elements.

BRIEF DESCRIPTION OF THE DRAWINGS

A preferred, non-limiting embodiment of the present disclosure will be described by way of example with reference to the accompanying drawings, in which.

DETAILED DESCRIPTION OF THE PREFERRED EMBODIMENTS

Hereinafter, various embodiments of the present disclosure will be described with reference to the accompanying drawings. In the following description of the various embodiments, like reference characters or numerals designate like or equivalent component parts throughout the several diagrams.

Exemplary Embodiment

A description will be given of a drive device equipped with a signal transmission device according to an exemplary embodiment of the present disclosure with reference to FIG. 1 to FIG. 4A and FIG. 4B.

Figure 1:
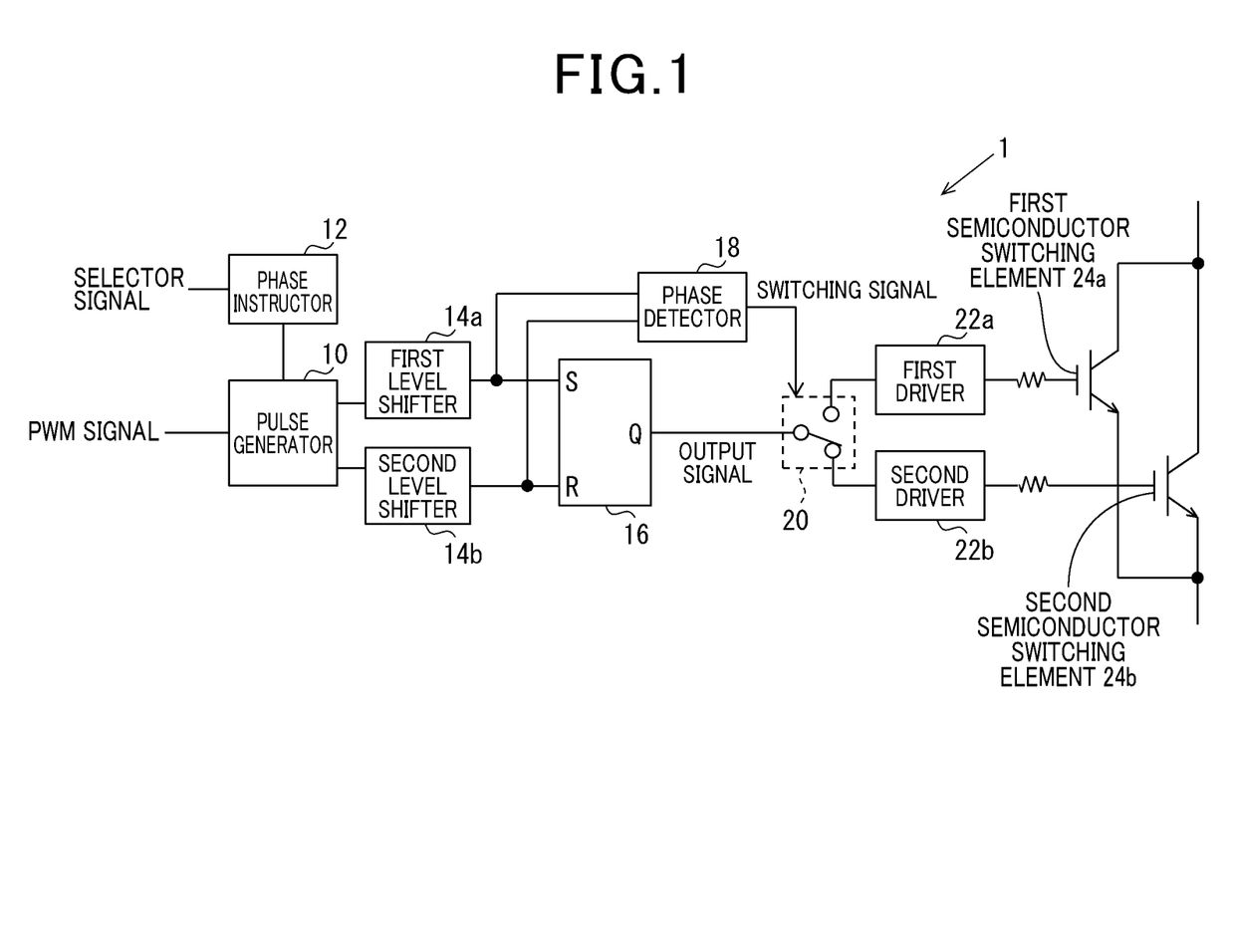
FIG. 1 is a block diagram showing a structure of a drive device equipped with a signal transmission device according to an exemplary embodiment of the present disclosure.

FIG. 1 is a block diagram showing a structure of the drive device 1 equipped with the signal transmission device according to the exemplary embodiment of the present disclosure.

As shown in FIG. 1, the drive device 1 has a structure which selectively drives one of a first semiconductor switching element 24a and a second semiconductor switching element 24b. The first semiconductor switching element 24a and the second semiconductor switching element 24b are connected in parallel.

Figure 2:
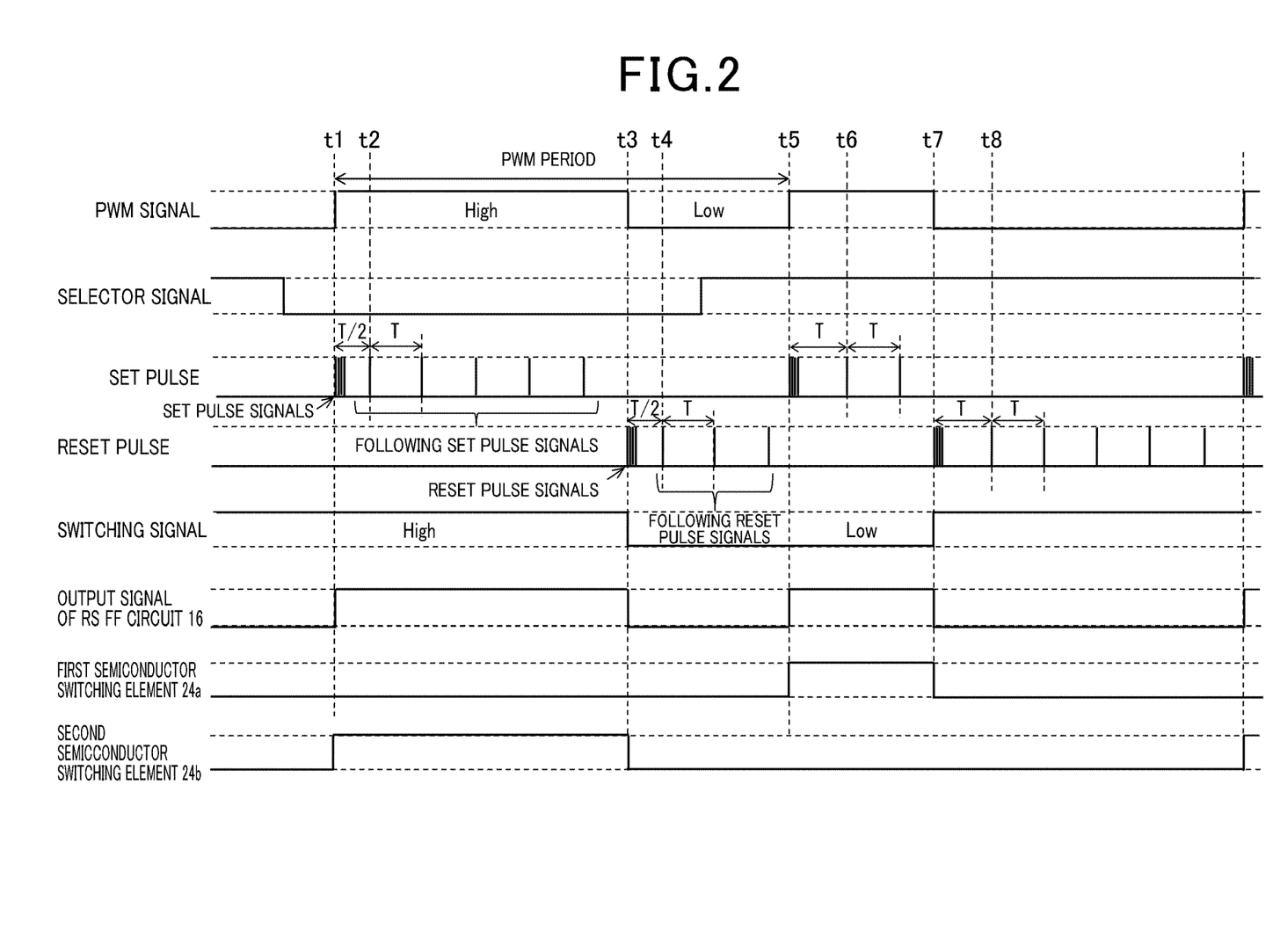
FIG. 2 is a timing chart showing waveforms of signals in components forming the drive device shown in FIG. 1.

FIG. 2 is a timing chart showing waveforms of various signals in components forming the drive device 1 shown in FIG. 1. These signals will be explained later in detail.

The first semiconductor switching element 24a and the second semiconductor switching element 24b are used as high voltage-side power devices to drive induction loads, for example, induction motors. It is preferable to use a high voltage Insulated Gate Bipolar Transistor (high voltage IGBT) and a Silicon Carbide Metal Oxide Field Effect Transistor (SiC MOSFET) as each of the first semiconductor switching element 24a and the second semiconductor switching element 24b, respectively. Further, it is acceptable to use an IGBT and a SiC MOSFET which have the same characteristics or different characteristics. For example, it is acceptable to use an IGBT as one of the first semiconductor switching element 24a and the second semiconductor switching element 24b, and to use a SiC MOSFET as the other semiconductor switching element.

As shown in FIG. 1, the drive device 1 has a pulse generator 10, a phase instructor 12, a first level shifter 14a, a second level shifter 14b, a RS flip-flop circuit 16, a phase detector 18, a switch circuit 20, a first driver 22a, and a second driver 22b. The RS flip-flop circuit 16 corresponds to an output circuit.

In the structure of the drive device 1 shown in FIG. 1, the phase instructor 12 receives a selector signal transmitted from an external microcomputer (not shown). The selector signal selects one of the first semiconductor switching element 24a and the second semiconductor switching element 24b. Through the description of the exemplary embodiment, this selector signal corresponds to a second signal.

The pulse generator 10 receives a pulse width modulation signal (PWM signal) transmitted from the external microcomputer (not shown). The PWM signal selects, as a drive target, one of the first semiconductor switching element 24a and the second semiconductor switching element 24b. Through the description of the exemplary embodiment, this PWM signal corresponds to a first signal.

It is acceptable for the pulse generator 10 to incorporate the phase instructor 12. In this structure, the pulse generator 10 receives both the selector signal (as the second signal) and the PWM signal (as the first signal).

In the structure of the drive device 1 shown in FIG. 1, the pulse generator 10 receives the PWM signal. As shown in FIG. 2, the pulse generator 10 generates a set pulse signal at a rising-edge timing when the received PWM signal switches from a Low level to a High level. The pulse generator 10 transmits the generated set pulse signal to the first level shifter 14a through a first output terminal thereof. Further, as shown in FIG. 2, the pulse generator 10 generates a reset pulse signal at a falling-edge timing when the received PWM signal switches from the High level to the Low level. The pulse generator 10 transmits the generated reset pulse signal to the second level shifter 14b through a second output terminal thereof.

As shown in FIG. 2, the pulse generator 10 is configured to generate following set pulse signals and following reset pulse signals during a predetermined period of time after when outputting the set pulse signals and the rest pulse signals. As shown in FIG. 2, the pulse generator 10 generates and transmits the following rest pulse signals and the following rest pulse signals every predetermined period T until the level of the PWM signal is switched.

As shown in FIG. 2, the pulse generator 10 is configured to generate and output the set pulse signal and the reset pulse signals multiple times (for example, seven times) until the following set pulse signal and the following rest pulse signal are transmitted at a first time. The reason why the set pulse signal and the reset pulse signal are transmitted multiple times is to reliably switch the state of the RS flip-flop circuit 16 on the basis of the multiple set pulse signals and reset pulse signals.

The external microcomputer (not shown) transmits the selector signal to the driver device 1 according to the exemplary embodiment so as to drive one of the first semiconductor switching element 24a and the second semiconductor switching element 24b. For example, the external microcomputer generates and transmits the selector signal of a Low voltage level so as to select the first semiconductor switching element 24a, and generates and transmits the selector signal of a High voltage level so as to drive the second semiconductor switching element 24b.

As shown in FIG. 1, the phase instructor 12 receives the selector signal transmitted from the external microcomputer (not shown). The phase instructor 12 generates a phase instruction signal on the basis of the voltage level of the received selector signal. The phase instruction signal represents a phase (i.e. an interval of time) counted from a start time when the set pulse signal and the reset pulse signal are generated and transmitted at the first time to the start time when the following set pulse signal and the following reset pulse signal are generated and transmitted at the first time. The phase instructor 12 transmits the generated phase instruction signal to the pulse generator 10.

As shown in FIG. 2, when the received selector signal has the Low voltage level, the phase instructor 12 generates the phase instruction signal which instructs the pulse generator 10 to use the phase (i.e. the interval of time) which corresponds to a half T/2 (see FIG. 2) of the output period T of the following pulse signals, where the phase (i.e. the interval of time) is counted from a start time t1 (see FIG. 2) when the set pulse signal is transmitted to a start time t2 (see FIG. 2) when the following set pulse signal is transmitted, and the phase (i.e. the interval of time) is counted from a start time t3 (see FIG. 2) when the reset pulse signal is transmitted to a start time t4 (see FIG. 2) when the following reset pulse signal is transmitted. The phase instructor 12 transmits the generated phase instruction signal to the pulse generator 10.

On the other hand, when the received selector signal has the High voltage level, the phase instructor 12 generates the phase instruction signal which instructs the pulse generator 10 to use the phase (i.e. the interval of time) which corresponds to the overall output period T of the following pulse signals, where the phase (i.e. the interval of time) is counted from a start time t5 (see FIG. 2) when the set pulse signal is transmitted to a start time t6 (see FIG. 2) when the following set pulse signal is transmitted, and the phase (i.e. the interval of time) is counted from a start time t7 (see FIG. 2) when the reset pulse signal is transmitted to a start time t8 (see FIG. 2) when the following reset pulse signal is transmitted. The phase instructor 12 transmits the generated phase instruction signal to the pulse generator 10.

In the structure of the drive device 1 shown in FIG. 1, the pulse generator 10 is configured to adjust, on the basis of the phase instruction signal transmitted from the phase instructor 12, the phase (i.e. the interval of time) counted from the start time t1, t5 when the set pulse signal is transmitted to the start time t2, t6 when the following set pulse signal is transmitted, and the phase (i.e. the interval of time) counted from the start time t3, t7 when the reset pulse signal is transmitted to the start time t4, t8 when the following reset pulse signal is transmitted.

As a result, the interval of time cab be adjusted on the bases of the voltage level of the selector signal transmitted from the external microcomputer (not shown), where this interval of time represents phase counted from the start time when the set pulse signal is transmitted to the start time when the following set pulse signal is transmitted, and the phase counted from the start time when the reset pulse signal is transmitted to the start time when the following reset pulse signal is transmitted.

A description will be given of the structure and behavior of each of the pulse generator 10 and the phase instructor 12 with reference to FIG. 3.

Figure 3:
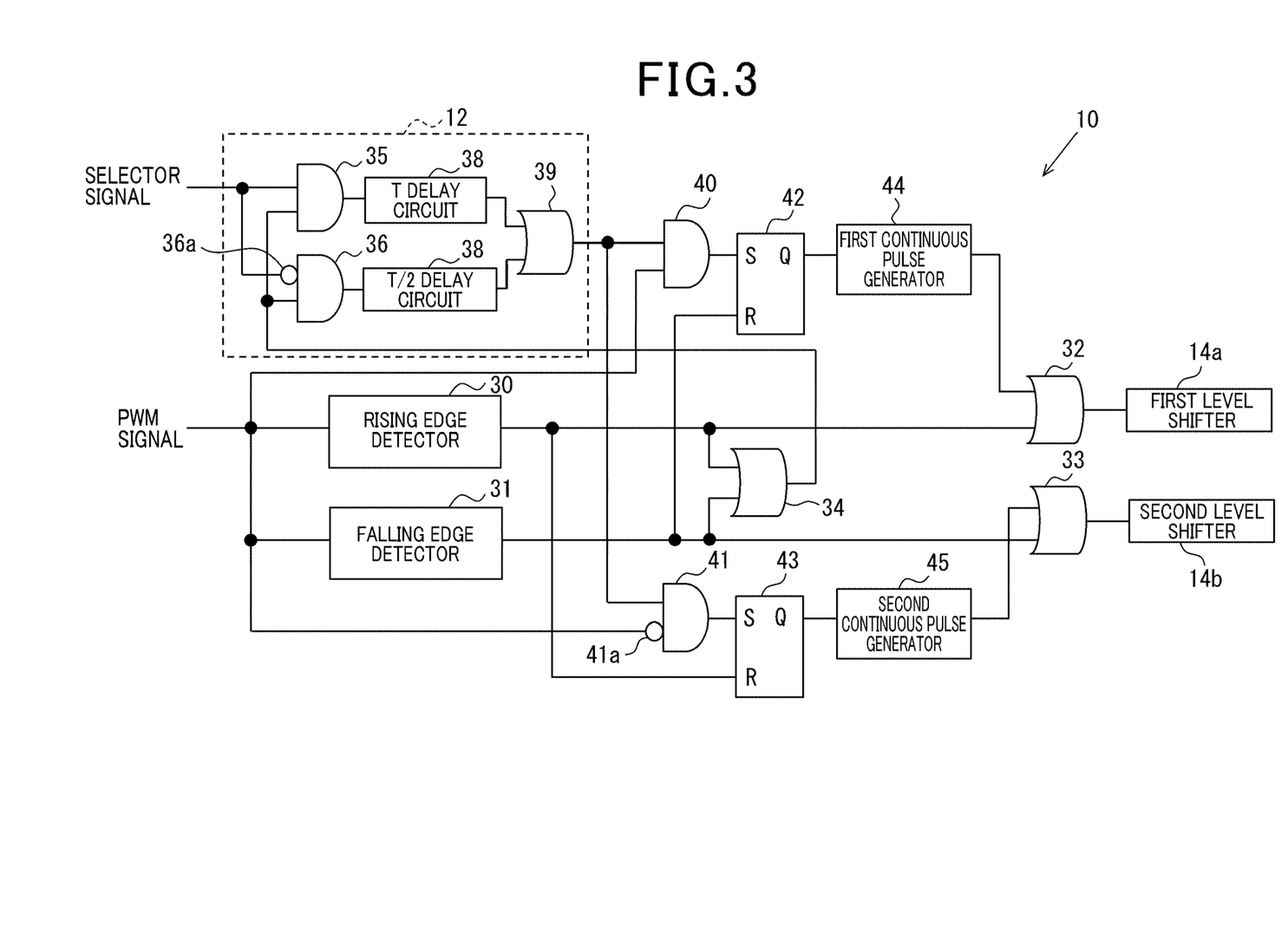
FIG. 3 is a block diagram showing a structure of each of a pulse generator and a phase instructor in the drive device shown in FIG. 1.

FIG. 3 is a block diagram showing a structure of each of the pulse generator 10 and the phase instructor 12 in the drive device 10 shown in FIG. 1. As shown in FIG. 3, the pulse generator 10 has a rising edge detector 30 and a falling edge detector 31.

Figure 4A:
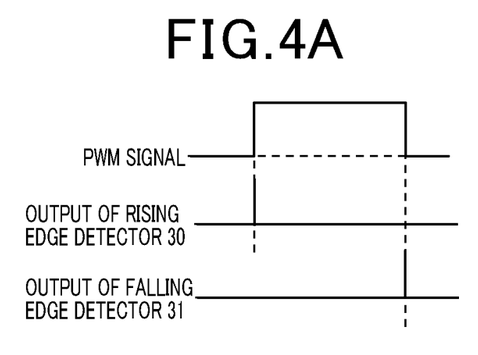
FIG. 4A is a view showing signal waveforms explaining operation of a rising edge detector and a falling edge detector in the pulse generator shown in FIG. 3.
Figure 4B:
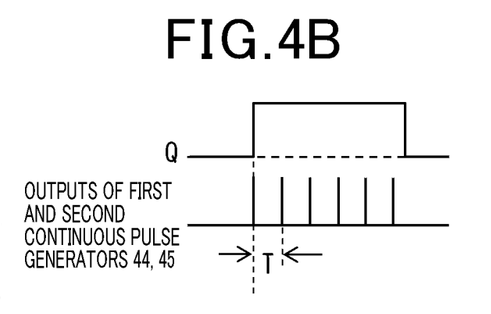
FIG. 4B is a signal waveform explaining operation of a first continuous pulse generator and a second continuous pulse generator in the pulse generator shown in FIG. 3.

FIG. 4A is a view showing output waveform of the rising edge detector 30 and the falling edge detector 31 in the pulse generator 10 shown in FIG. 3. FIG. 4B is output waveforms of a first continuous pulse generator 44 and a second continuous pulse generator 45 in the pulse generator 10 shown in FIG. 3.

As shown in FIG. 4A, the rising edge detector 30 generates the set pulse signals when detecting a rising edge of the PWM signal. The falling edge detector 31 generates the reset pulse signals when detecting a falling edge of the PWM signal.

The rising edge detector 30 transmits the set pulse signals to the first level shifter 14a through an OR circuit 32. The OR circuit 32 is an OR gate as a digital logic gate.

The falling edge detector 31 transmits the reset pulse signal to the second level shifter 14b through an OR circuit 33.

The OR circuit 32 corresponds to the first output terminal of the pulse generator 10, and the OR circuit 33 corresponds to the second output terminal of the pulse generator 10.

As shown in FIG. 3, the rising edge detector 30 further transmits the set pulse signals to an OR circuit 34. Similarly, the falling edge detector 31 further transmits the reset pulse signals to the OR circuit 34. The OR circuit 34 is the OR gate as a digital logic gate. The OR circuit 34 transmits a pulse signal when receiving the set pulse signal or the reset pulse signal. That is, the OR circuit 34 transmits the pulse signal to one input terminal of an AND circuit 35 in the phase instructor 12 and one input terminal of an AND circuit 36. Each of the AND circuit 35 and the AND circuit 36 is an AND gates as a digital logic gate.

As shown in FIG. 3, the other input terminal of the AND circuit 35 receives the selector signal. The other input terminal 36a of the AND circuit 36 is an inverted input terminal. The inverted input terminal 36a of the AND circuit 36 receives the selector signal. Accordingly, when the selector signal has the High voltage level (High), the pulse signal transmitted from the OR circuit 34 passes through the AND circuit 35. On the other hand, when the selector signal has the Low voltage level (Low), the pulse signal transmitted from the OR circuit 34 passes through the AND circuit 36.

When the pulse signal transmitted from the OR circuit 34 AND circuit 35 has passed through the AND circuit 35, a T delay circuit 37 receives the pulse signal transmitted from the AND circuit 35. The T delay circuit 37 starts to transmit a T-delayed pulse signal when the period T has been elapsed after receiving the pulse signal.

On the other hand, when the pulse signal transmitted from the OR circuit 34 has passed through the AND circuit 36, a T/2 delay circuit 38 receives the pulse signal transmitted from the AND circuit 36. The T/2 delay circuit 38 starts to transmit a T/2-delayed pulse signal when the period T/2 (which is the half of the period T) has been elapsed after receiving the pulse signal.

The T-delayed pulse signal transmitted from the T delay circuit 37 and the T/2-delayed pulse signal transmitted from the T/2 delay circuit 38 correspond to the phase instruction signals.

An OR circuit 39 receives the T-delayed pulse signal transmitted from the T delay circuit 37 and the T/2-delayed pulse signal transmitted from the T/2 delay circuit 38. The OR circuit 39 is also the OR gate as a digital logic gate.

When receiving the delayed pulse signal transmitted from one of the T delay circuit 37 and the T/2 delay circuit 38, the OR circuit 39 transmits the received delayed pulse signal to one input terminal of an AND circuit 40 and one input terminal of an AND circuit 41. Each of the AND circuit 40 and the AND circuit 41 is the AND gate as a digital logic gate.

As shown in FIG. 3, the other input terminal of the AND circuit 40 receives the PWM signal. The other input terminal 41a of the AND circuit 41 is an inverted input terminal. The inverted input terminal 41a of the AND circuit 41 also receives the PWM signal.

Accordingly, when receiving the PWM signal of the High voltage level (High), the AND circuit 40 allows the delayed pulse signal transmitted from the OR circuit 39 to be transmitted to a first flip-flop circuit 42 through the AND circuit 40.

On the other hand, the when receiving the PWM signal of the Low voltage level (Low), the AND circuit 41 allows the delayed pulse signal transmitted from the OR circuit 39 to be transmitted to the first flip-flop circuit 42 through the AND circuit 40.

As shown in FIG. 3, each of the first flip-flop circuit 42 and a second flip-flop circuit 43 has a set input terminal S, a reset input terminal R and an output terminal Q.

The set input terminal S of the first flip-flop circuit 42 receives the delayer pulse signal transmitted from the AND circuit 40. The set input terminal S of the second flip-flop circuit 43 receives the delayed pulse signal transmitted from the AND circuit 41.

When receiving the delayed pulse signal through the set input terminal S, each of the first flip-flop circuit 42 and the second flip-flop circuit 43 transmits a High voltage output signal (High) through the output terminal Q thereof.

When receiving the pulse signal through the reset input terminal R, each of the first flip-flop circuit 42 and the second flip-flop circuit 43 transmits a Low voltage output signal (Low) through the output terminal Q thereof.

The reset input terminal R of the first flip-flop circuit 42 receives the output signal of the falling edge detector 31. The reset input terminal R of the second flip-flop circuit 43 receives the output signal of the rising edge detector 30.

As shown in FIG. 3, the first continuous pulse generator 44 is connected to the output terminal Q of the first flip-flop circuit 42. the second continuous pulse generator 45 is connected to the output terminal Q of the second flip-flop circuit 43.

As shown in FIG. 4A, each of the first continuous pulse generator 44 and the second continuous pulse generator 45 continuously generates the pulse signals every interval of the period T during the period of time when the output terminal Q of the first flip-flop circuit 42 and the second flip-flop circuit 43 transmits the High level output signal. When switching the output signal to the Low voltage level from the High voltage level through the output terminal Q, each of the first continuous pulse generator 44 and the second continuous pulse generator 45 stops generating and transmitting the pulse signals.

When receiving the output signal transmitted from the first continuous pulse generator 44, the OR circuit 32 generates and transmits the following set pulse signals to the first level shifter 14a.

On the other hand, when receiving the output signal transmitted from the second continuous pulse generator 45, the OR circuit 33 generates and transmits the following set pulse signals to the second level shifter 14b.

In the driver device 1 according to the exemplary embodiment in which the pulse generator 10 and the phase instructor 12 have the structure previously described, when the rising edge detector 30 detects a rising edge of the PWM signal, and transmits the set pulse signals, the first continuous pulse generator 44 continuously generates and transmits pulse signals as the following set pulse signals during the period T. The first continuous pulse generator 44 transmits the following set pulse signals to the first level shifter 14a through the OR circuit 32.

The phase varies, i.e. becomes one of the period T and the half period T/2 on the basis of the delayed pulse signal transmitted from the phase instructor 12, where this phase represents the interval of time counted from the start time when the set pulse signal is generated and transmitted at the first time to the start time when the following set pulse signal is generated and transmitted at the first time.

When the falling edge detector 31 transmits the reset pulse signal due to the detection of the falling edge of the PWM signal, the first flip-flop circuit 42 is reset. Accordingly, when the first continuous pulse generator 44 receives the Low voltage output signal transmitted from the first flip-flop circuit 42, the first continuous pulse generator 44 stops continuously transmitting the set pulse signals to the first level shifter 14a through the OR circuit 32.

In addition, when the falling edge detector 31 transmits the reset pulse signal due to the detection of the falling edge of the PWM signal, the second continuous pulse generator 45 continuously generates and transmits pulse signals as the following reset pulse signals to the second level shifter 14b through the OR circuit 33.

The phase varies on the basis of the delayed pulse signal transmitted from the phase instructor 12, where this phase represents the interval of time counted from the start time when the reset pulse signal is generated and transmitted at the first time to the start time when the following reset pulse signal is generated and transmitted at the first time.

When the rising edge detector 30 transmits the set pulse signal due to the detection of the rising edge of the PWM signal, the second flip-flop circuit 43 is reset. Accordingly, when the second continuous pulse generator 45 receives the Low voltage output signal transmitted from the second flip-flop circuit 43, the second continuous pulse generator 45 stops continuously transmitting the reset pulse signals to the second level shifter 14b through the OR circuit 33.

The phase instructor 12 transmits the delayed pulse signal, as the phase instruction signal corresponding to the voltage level of the selector signal, to the AND circuit 40 and the AND circuit 41 in the pulse generator 10. The pulse generator 10 adjusts the phase within a phase range between the phase T and the half phase T/2 on the basis of the delayed pulse signal transmitted from the phase instructor 12, where the phase represents the interval of time counted from the start time when the set pulse signal is generated and transmitted at the first time to the start time when the following set pulse signal is generated and transmitted at the first time, and this phase also represents the interval of time counted from the start time when the reset pulse signal is generated and transmitted at the first time to the start time when the following reset pulse signal is generated and transmitted at the first time.

That is, the pulse generator 10 adjusts the phase corresponding to the period T when the selector signal has the High voltage level (High). On the other hand, the pulse generator 10 adjusts the phase corresponding to the half period T/2, when the selector signal has the Low voltage level (Low).

A description will now be given of the structure of other components in the drive device 1 according to the exemplary embodiment with reference to FIG. 1 and FIG. 2.

Each of the first level shifter 14a and the second level shifter 14b transmits the set pulse signals, the reset pulse signals, the following set pulse signals and the following reset pulse signals between circuit blocks which operate at a different power source voltage. That is, the pulse generator 10 and the phase instructor 12 belong to a circuit block which operates at a relatively low power source voltage. On the other hand, the RS flip-flop circuit 16, the phase detector 18, the switch circuit 20, the first driver 22a and the second driver 22b belong to a circuit block which operates at a relatively high power source voltage.

Each of the first level shifter 14a and the second level shifter 14b is equipped with a level shifter transistor and an inverter. A gate terminal of the level shifter transistor in each of the first level shifter 14a and the second level shifter 14b receives the set pulse signal, the reset pulse signals, the following set pulse signals and the following reset pulse signals transmitted from the pulse generator 10.

A gate terminal of the level shifter transistor in each of the first level shifter 14a and the second level shifter 14b receives a high voltage, and is connected through the inverter (not shown) to the set input terminal S (as the first input terminal) of the RS flip-flop circuit 16, and the reset input terminal R (as the second input terminal) of the RS flip-flop circuit 16.

Accordingly, when the level shifter transistor in the first level shifter 14a is turned on due to the voltage level of the set pulse signal, the set input terminal S of the RS flip-flop circuit 16 receives the set pulse signals having a pulse shape. As shown in FIG. 2, this makes it possible to allow the output terminal Q of the RS flip-flop circuit 16 to transmit the High voltage output signal (High) which corresponds to the High voltage level of the PWM signal.

Because the pulse generator 10 transmits the following set pulse signals after the transmission of the set pulse signals, the set input terminal S of the RS flip-flop circuit 16 receives the following set pulse signals. However, because the RS flip-flop circuit 16 has entered the state of transmitting the High voltage output signal through the output terminal Q thereof, the reception of the following set pulse signals does not affect the state of the RS flip-flop circuit 16. However, when the RS flip-flop circuit 16 has entered a state of transmitting no High voltage output signal, the reception of the following set pulse signals turns on the flip-flop circuit 16 to transmit the High voltage output signal through the output terminal Q thereof.

On the other hand, when the level shifter transistor in the second level shifter 14b is turned on due to the voltage level of the reset pulse signal, the reset input terminal R of the RS flip-flop circuit 16 receives the set pulse signals having a pulse shape. As shown in FIG. 2, this makes it possible to allow the output terminal Q of the RS flip-flop circuit 16 to transmit the Low voltage output signal (Low) which corresponds to the Low voltage level of the PWM signal.

Similar to the following set pulse signals previously described, because the pulse generator 10 transmits the following reset pulse signals after the transmission of the reset pulse signals, the reset input terminal R of the RS flip-flop circuit 16 receives the following reset pulse signals. However, because the RS flip-flop circuit 16 has entered the state of transmitting the Low voltage output signal through the output terminal Q thereof, the reception of the following reset pulse signals does not affect the state of the RS flip-flop circuit 16. However, when the RS flip-flop circuit 16 has entered a state of transmitting no Low voltage output signal, the reception of the following set pulse signals turns on the flip-flop circuit 16 to transmit the High voltage output signal through the output terminal Q thereof.

As previously described, the RS flip-flop circuit 16 transmits the output signal approximately in synchronization with the variation in voltage level of the PWM signal received by the drive device 1.

It is acceptable that the voltage level of the PWM signal received by the drive device 1 is equal to the voltage level of or the inverted voltage level of the output signal of the RS flip-flop circuit 16.

As shown in FIG. 1, the phase detector 18 also receives the output signal transmitted to the set input terminal S of the RS flip-flop circuit 16 from the first level shifter 14a and the output signal transmitted to the reset input signal R of the second level shifter 14b from the second level shifter 14b.

When receiving the set pulse signals and the following set pulse signals, the phase detector 18 detects whether the phase corresponds to the period T of the following set pulse signals or the half period T/2 thereof, where as previously explained, this phase represents the interval of time counted from the start time when the set pulse signal is generated and transmitted at the first time to the start time when the following set pulse signal is generated and transmitted at the first time.

Further, when receiving the reset pulse signals and the following reset pulse signals, the phase detector 18 detects whether the phase corresponds to the period T of the following set pulse signals or the half period T/2 thereof, where this phase represents the interval of time counted from the start time when the reset pulse signal is generated and transmitted at the first time to the start time when the following reset pulse signal is generated and transmitted at the first time.

The phase detector 18 generates a switching signal to switch the connection state of the switch circuit 20 so that the one of the first semiconductor switching element 24a and the second semiconductor switching element 24b selected based on the detection result of the phase detector 18 receives the output signal transmitted from the RS flip-flop circuit 16. The phase detector 18 has a latch circuit therein so as to maintain the detection result.

When receiving the set pulse signal and the reset pulse signal, the phase detector 18 generates and transmits the switching signal to the switch circuit 20.

For example, in the structure and behavior of the drive device 1 shown in FIG. 1 and FIG. 2, the phase detector 18 transmits the switching signal to the switch circuit 20 so that the second driver 22b receives the output signal transmitted from the RS flip-flop circuit 16 at a timing when the phase detector 18 receives the following reset pulse signal or the set pulse signal after the phase becomes corresponding to the period T of the following pulse signals (i.e. the following set pulse signals or the following reset pulse signals), where the phase the interval of time counted from the start time when the set pulse signal and the reset pulse signal are generated and transmitted at the first time to the start time when the following set pulse signal and the following reset pulse signal are generated and transmitted at the first time. This control makes it possible to perform the PWM drive of the second semiconductor switching element 24b on the basis of the output signal of the RS flip-flop circuit 16.

On the other hand, the phase detector 18 transmits the switching signal to the switch circuit 20 so that the first driver 22a receives the output signal transmitted from the RS flip-flop circuit 16 at a timing when the phase detector 18 receives the following set pulse signal or the reset pulse signal after the phase becomes corresponding to the half period T/2 of the following pulse signals, where the phase the interval of time counted from the start time when the set pulse signal and the reset pulse signal are generated and transmitted at the first time to the start time when the following set pulse signal and the following reset pulse signal are generated and transmitted at the first time. This control makes it possible to perform the PWM drive of the first semiconductor switching element 24a on the basis of the output signal of the RS flip-flop circuit 16.

The switch circuit 20 switches the transmission of the output signal of the RS flip-flop circuit 16 between the first driver 22a and the second driver 22b.

For example, the first driver 22a has a PMOS transistor and a NMOS transistor. The PMOS transistor is a drive element arranged between the high voltage side of the power source and the gate terminal of the first semiconductor switching element 24a. The NMOS transistor is a drive element arranged between the low voltage side of the power source and the gate terminal of the first semiconductor switching element 24a.

The RS flip-flop circuit 16 transmits the output signal of the High voltage level (High) to the first driver 22a through the switch circuit 20. When receiving the output signal of the High voltage level (High) transmitted from the RS flip-flop circuit 16, the PMOS transistor in the first driver 22a is turned on and the NMOS transistor is turned off in the first driver 22a. This state of the first driver 22a supplies the High voltage to the gate terminal of the first semiconductor switching element 24a. The first semiconductor switching element 24a is thereby turned on.

On the other hand, the RS flip-flop circuit 16 transmits the output signal of the Low voltage level (Low) to the first driver 22a through the switch circuit 20. When receiving the output signal of the Low voltage level (Low) transmitted from the RS flip-flop circuit 16, the PMOS transistor in the first driver 22a is turned off and the NMOS transistor is turned on in the first driver 22a. This state of the first driver 22a supplies the Low voltage to the gate terminal of the first semiconductor switching element 24a. The first semiconductor switching element 24a is thereby turned off. This state of the first driver 22a supplies the Low voltage to the gate terminal of the first semiconductor switching element 24a. The first semiconductor switching element 24a is thereby turned off. As previously described, the first semiconductor switching element 24a is turned on/off based on the output signal of the RS flip-flop circuit 16.

Because the second driver 22b has the same structure of the first driver 22a, the second semiconductor switching element 24b is driven based on the output signal of the RS flip-flop circuit 16 when the phase detector 18 switches the output signal of the RS flip-flop circuit 16 to the second driver 22b.

A description will now be given of technical features and effects of the drive device 1 according to the exemplary embodiment.

In the structure of the drive device 1 according to the exemplary embodiment previously described, when receiving the set pulse signal through the set input terminal S thereof, the RS flip-flop circuit 16 transmits the High voltage level of the output signal which corresponds to the High voltage level of the PWM signal. On the other hand, when receiving the reset pulse signal through the reset input terminal R thereof, the RS flip-flop circuit 16 transmits the Low voltage level of the output signal which corresponds to the Low voltage level of the PWM signal. That is, after the drive device 1 receives the PWM signal, the PWM signal is transmitted to the RS flip-flop circuit 16 through the pulse generator 10, the first level shifter 14a and the second level shifter 14b. The RS flip-flop circuit 16 varies its output signal in synchronization with the level change of the PWM signal. That is, the RS flip-flop circuit 16 transmits the output signal which corresponds to the voltage level of the received PWM signal.

In the structure of the drive device 1 according to the exemplary embodiment previously described, the pulse generator 10 transmits either the set pulse signals or the reset pulse signals on the basis of the switching time of the voltage level of the received PWM signal. Further, the pulse generator 10 transmits either the following set pulse signals or the following reset pulse signals. In this case, the pulse generator 10 adjusts, i.e. changes the predetermined period of time on the basis of the select signal which changes either the High voltage level (High) or the Low voltage level (Low), where the predetermined period of time represents the time length from the start time when the set pulse signal or the reset pulse signal is transmitted at the first time to the start time when the following set pulse signal or the following reset pulse signal is transmitted at the first time.

In the structure of the drive device 1 according to the exemplary embodiment previously described, when the selector signal has the High voltage level (High), the pulse generator 10 transmits the following pulse signal at the first time when the period of time has been elapsed, where this period of time corresponds to the period T of the following pulse signals counted from the time when transmitting the set pulse signal or the reset pulse signal.

Further, when the selector signal has the Low voltage level (Low), the pulse generator 10 transmits the following pulse signal at the first time when the period of time has been elapsed, where this period of time corresponds to the half period T/2 of the following pulse signals counted from the time when transmitting the set pulse signal or the reset pulse signal.

Accordingly, this structure makes it possible for the phase detector 18 to detect the state (High voltage level or Low voltage level) of the selector signal on the basis of the period of time counted from the time when the set input terminal S of the RS flip-flop circuit 16 receives the set pulse signal to the time when receiving the following set pulse signal at the first time, or on the basis of the period of time counted from the time when the reset input terminal R of the RS flip-flop circuit 16 receives the reset pulse signal to the time when receiving the following reset pulse signal at the first time. This structure makes it possible to transmit the selector signal to the phase detector 18 through the pulse generator 10, the first level shifter 14a and the second level shifter 14b.

As shown in FIG. 2, the phase detector 18 cannot detect the change in voltage level of the selector signal until receiving the set pulse signal and the first following set pulse signal or until receiving the reset pulse signal and the first following reset pulse signal. In other words, there occurs a delayed period of time which depends on the change timing of the voltage level of the PWM signal until the phase detector 18 receives the selector signal.

Because the drive device 1 according to the exemplary embodiment uses the selector signal to switch the first semiconductor switching element 24a and the second semiconductor switching element 24b, it is acceptable to occur a transmission delay.

As previously described in detail, the drive device 1 according to the exemplary embodiment reliably transmits the selector signal to the switch circuit 20 so as to select and drive the first semiconductor switching element 24a and the second semiconductor switching element 24b on the basis of the period of time counted from the time when the set pulse signal or the reset pulse signal is transmitted to the time when the following set pulse signal or the following reset pulse signal is transmitted at the first time. This control makes it possible for the circuits to have the same structure so as to transmit the output signals to the first driver 22a and the second driver 22b to drive the first semiconductor switching element 24a and the second semiconductor switching element 24b. In other words, the improved structure of the drive device 1 can avoid the use of different circuit structure for transmitting control signals to each of the first driver 22a and the second driver 22b so as to drive the first semiconductor switching element 24a and the second semiconductor switching element 24b. This structure makes it possible to suppress the total number of circuit components forming the drive device 1 from increasing, and to avoid the manufacturing cost of the drive device 1 from increasing.

Other Modifications

A description will be given of various modifications of the drive device 1 according to the exemplary embodiment with reference to FIG. 5 and FIG. 6.

Figure 5:
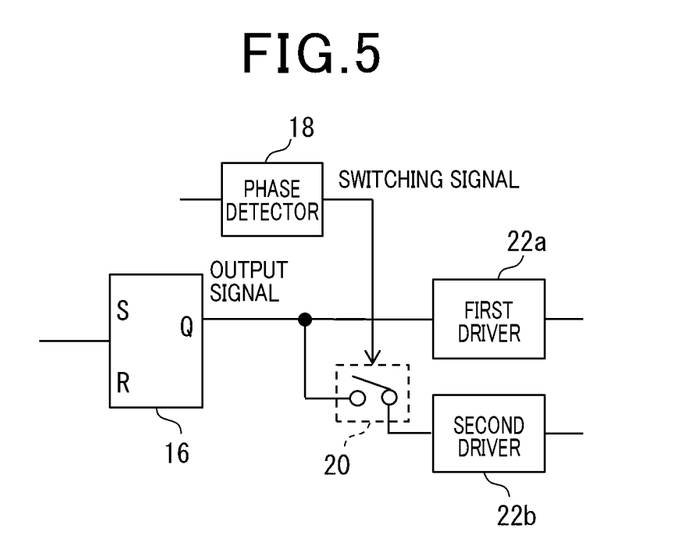
FIG. 5 is a view showing a partial structure of a modification of the drive device according to the exemplary embodiment shown in FIG. 1.
Figure 6:
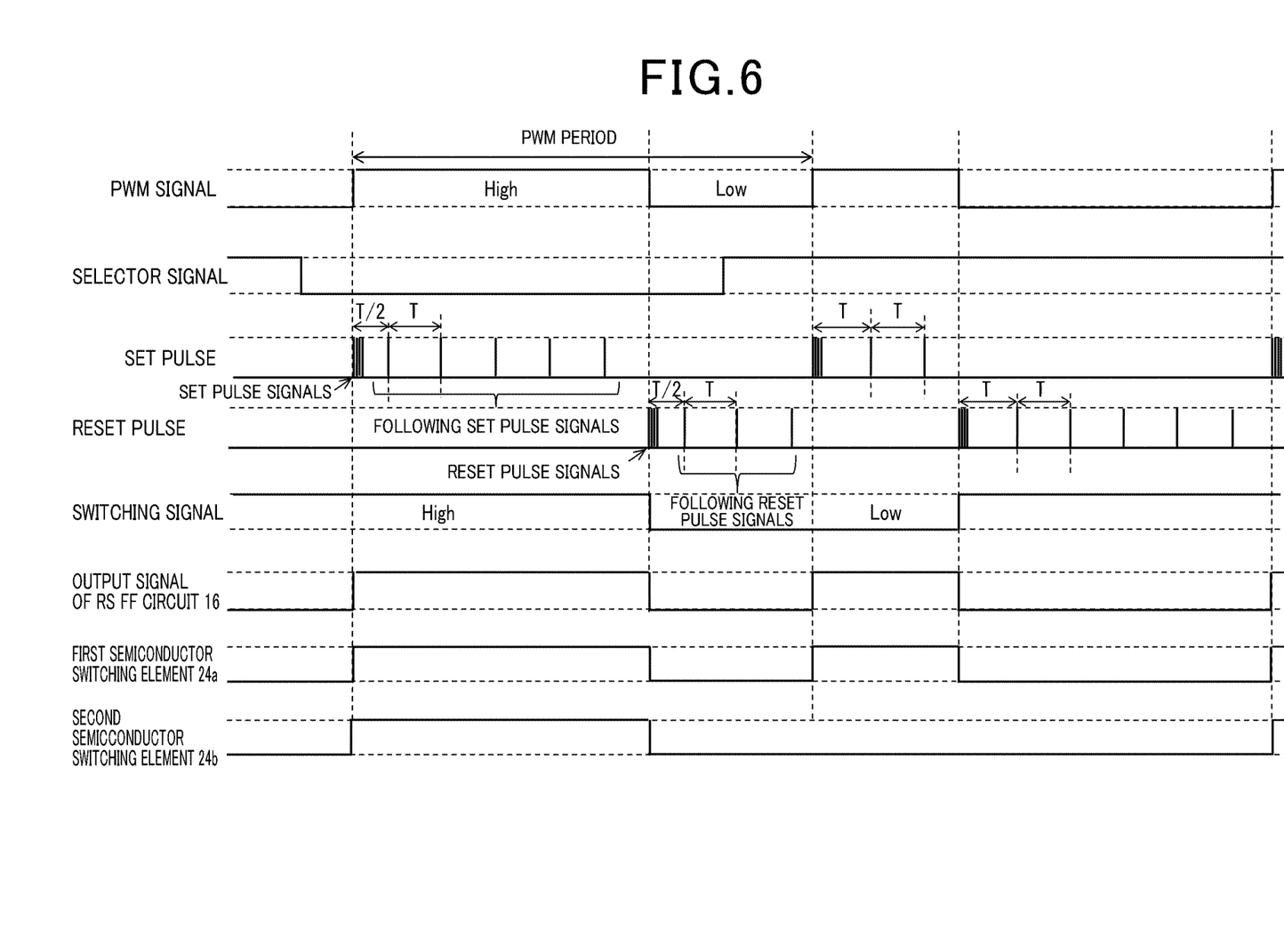
FIG. 6 is a timing chart showing waveforms of signals in the components forming the drive device shown in FIG. 5.

FIG. 5 is a view showing a partial structure of a modification of the drive device 1 according to the exemplary embodiment shown in FIG. 1. FIG. 6 is a timing chart showing waveforms of signals in the components forming the modification of the drive device shown in FIG. 5.

As previously described, the drive device 1 according to the exemplary embodiment has the structure to select one of the first semiconductor switching element 24a and the second semiconductor switching element 24b. However, the concept of the present disclosure is not limited by the exemplary embodiment. For example, as shown in FIG. 5 and FIG. 6, it is acceptable to always turn on/off one of the switching element 24a, for example the first semiconductor switching element 24a on the basis of the voltage level of the PWM signal, and to turn on/off the other switching element, i.e. the second semiconductor switching element 24b on the basis of a combination of the selector signal and the PWM signal.

In the modification of the drive device shown in FIG. 5, the first driver 22a is directly connected to output terminal Q of the RS flip-flop circuit 16 without through the switch circuit 20. That is, the first driver 22a always drives, i.e. turns on/off the first semiconductor switching element 24a on the basis of the output signal of the RS flip-flop circuit 16, which is switched in synchronized with the voltage level of the PWM signal.

On the other hand, the second driver 22b is connected to the output terminal Q of the RS flip-flop circuit 16 through the switch circuit 20. The switching state of the switch circuit 20 is switched on the basis of the switching signal transmitted from the phase detector 18. For example, when the phase detector 18 transmits the selector signal of the High voltage level (High), the switch circuit 20 is turned on, and the output terminal Q of the RS flip-flop circuit 16 is connected to the second driver 22b through the switch circuit 20. On the other hand, when the phase detector 18 transmits the selector signal of the Low voltage level (Low), the switch circuit 20 is not turned on, and the output terminal Q of the RS flip-flop circuit 16 is not connected to the second driver 22b through the switch circuit 20. The second driver 22b does not drive the second semiconductor switching element 24b.

Further, it is acceptable for the drive device 1 to have a modification of the structure which simultaneously drives both the first semiconductor switching element 24a and the second semiconductor switching element 24b in addition to the structure which selectively drives one of the first semiconductor switching element 24a and the second semiconductor switching element 24b. This structure uses the selector signal of three voltage states, and uses the phase (i.e. the interval of time) having three states, for example, T/3, 2T/3 and T, where this phase represents the period of time counted from the start time when the set pulse signal or the reset pulse signal is transmitted to the time when the following set pulse signal or the following reset pulse signal is transmitted at the first time. In addition, the switch circuit is configured to switch three switching states. In the first switching state, the output signal of the RS flip-flop circuit 16 is transmitted to the first drive circuit 22a so as to drive the first semiconductor switching element 24a. In the second switching state, the output signal of the RS flip-flop circuit 16 is transmitted to the second drive circuit 22b so as to drive the second semiconductor switching element 24b. In the third switching state, the output signal of the RS flip-flop circuit 16 is transmitted to both the first drive circuit 22a and the second drive circuit 22b so as to simultaneously drive the first semiconductor switching element 24a and the second semiconductor switching element 24b. The phase detector 18 detects that the phase corresponds to which phase (i.e. one of T/3, 2T/3, T), where the phase represents the period of time counted from the start time when the set pulse signal or the reset pulse signal is transmitted to the time when the following set pulse signal or the following reset pulse signal is transmitted at the first time. The phase detector 18 selects one of the first switching state, the second switching state and the third switching state on the basis of the detection result.

It is also acceptable for the drive device to have a structure in which three semiconductor switching elements are arranged in parallel, and one of them is selectively driven, and a combination of them are driven simultaneously.

In the structure of the drive device 1 previously described, the pulse generator 10 changes the phase counted from the time when the set pulse signal or the reset pulse signal is transmitted at the first time to the time when the following set pulse signal or the following reset pulse signal is transmitted at the first time on the basis of the phase instruction signal transmitted from the phase instructor 12. Further, regardless of the voltage state of the selector signal, the drive device 1 uses a constant value of each of the period T of the following pulse signals, i.e. the period of the following set pulse signals and the period of the following reset pulse signals.

However, the concept of the present disclosure is not limited by this. For example, it is acceptable for the pulse generator 10 to generate and transmit the following pulse signals so long as the pulse generator 10 changes the phase, i.e. the interval of time counted from the time when the set pulse signal or the reset pulse signal is transmitted at the first time to the time when the following set pulse signal or the following reset pulse signal is transmitted at the first time.

For example, it is acceptable for the pulse generator 10 to generate a plurality of pulse signals having a different frequency corresponding to each state of the selector signal, and acceptable to change the period of time counted from the time when the set pulse signal or the reset pulse signal is transmitted at the first time to the time when the following set pulse signal or the following reset pulse signal is transmitted at the first time on the basis of the generated pulse signals having a different frequency.

It is further acceptable for the pulse generator 10 to generate and transmit one pulse signal only as the following pulse signal.

In the structure of the drive device according to the exemplary embodiment previously described, the signal transmission device is incorporated into the drive device, and the signal transmission device generates and transmits the PWM signal and the selector signal so as to drive the circuit blocks such as the first semiconductor switching element 24a and the second semiconductor switching element 24b which are driven by a different power source voltage.

However, the concept of the present disclosure is not limited by this. For example, it is acceptable for the signal transmission device to further generate and transmit control signals to be used for other control in addition to the transmission of the PWM signal and the selector signal. That is, in the structure in which the pulse generator 10 generates and transmits, through the RS flip-flop circuit 16 to the block circuits, the first signal which has either the High voltage level or the Low voltage level and is used between the block circuits to be driven by a different power source voltage, it is possible for the pulse generator 10 to transmit the second signal which varies in a plurality of voltage levels on the basis of the interval of time counted from the time when the set pulse signal or the reset pulse signal is transmitted at the first time to the time when the following set pulse signal or the following reset pulse signal is transmitted at the first time.

Incidentally, it is acceptable to use semiconductor switching elements, as a power device, connected in parallel so as to allow a large current to flow and to reduce a switching loss. In a related art, the semiconductor switching elements connected in parallel are often turned on simultaneously or some of the semiconductor switching elements are turned on according to a magnitude of a current passing there through. A related art uses drive circuits which are provided to the respective semiconductor switching elements so as to selectively drive the semiconductor switching elements. This increases the total number of the drive circuits and other components, and a manufacturing cost also increases. This problem is also emphasized when the signal transmission device of a related art has a circuit structure using a set pulse signal, a reset pulse signal, for example, a turn-on signal and a turn-off signal generated by the pulse generator to be transmitted between circuit blocks operating a different voltage.

On the other hand, in the signal transmission device according to the present disclosure previously described, the output circuit enters a state to transmit the output signal of the High voltage level which corresponds to the High voltage level of the first signal when receiving the set pulse signal through the first input terminal of the output circuit. Further, the output circuit enters the state to transmit the output signal of the Low voltage level which corresponds to the Low voltage level of the first signal when receiving the reset pulse signal through the second input terminal of the output circuit. That is, in the signal transmission device of the present disclosure, the first signal is transmitted to the output circuit through the pulse generator which generates and transmits the set pulse signal or the reset pulse signal in accordance with the variation of the voltage level of the first signal. The output circuit generates and transmits the output signal in accordance with the voltage level of the first signal. Further, in the signal transmission device of the present disclosure, the pulse generator transmits the set pulse signal or the reset pulse signal at the time when the voltage level of the first signal is changed. Further, the pulse generator generates and transmits at least one following pulse signal after elapse of the predetermined period of time counted from the time when the set pulse signal or the reset pulse signal is transmitted. Still further, based on the second signal which has a plurality of voltage states, the pulse generator changes the predetermined period of time counted from the time when the set pulse signal or the reset pulse signal is transmitted to the time when the following pulse signal is transmitted at the first time. Accordingly, this improved structure makes it possible for the detector to correctly detect the voltage state of the second signal on the basis of the period of time when the output circuit receives the set pulse signal through the first input terminal to the time when the output circuit receives the following set pulse signal through the first input terminal, or the period of time when the output circuit receives the reset pulse signal through the second input terminal to the time when the output circuit receives the following reset pulse signal through the second input terminal. This structure of the signal transmission device according to the present disclosure makes it possible to reliably transmit the second signal to the detector through the pulse generator.

Still further, the present disclosure provides the drive device having a switch circuit, a plurality of drivers, and the data transmission device having the pulse generator, the output circuit and the detector. The drive device drives a plurality of semiconductor switching elements.

The pulse generator has the first output terminal and the second output terminal. The pulse generator receives the pulse width modulation signal (PWM signal) as the first signal which has either a High voltage level or a Low voltage level. The pulse generator generates the set pulse signal based on a voltage level change of the PWM signal from the High voltage level to the Low voltage level, and transmits the set pulse signal through the first output terminal. The pulse generator generates the reset pulse signal based on the voltage level change of the PWM signal as the first signal from the Low voltage level to the High voltage level, and transmits the reset pulse signal through the second output terminal. The output circuit has the first input terminal, the second input terminal and the third output terminal. The output circuit transmits the first output signal, which corresponds to the High voltage level of the PWM signal, through the third output terminal when the first input terminal receives the set pulse signal transmitted from the pulse generator. The output circuit transmits the second output signal, which corresponds to the Low voltage level of the PWM signal, through the third output terminal when the second input terminal receives the reset pulse signal transmitted from the pulse generator. The plurality of drivers, arranged respectively corresponding to the plurality of semiconductor switching elements, transmit drive signals to the respective semiconductor elements on the basis of the first output signal and the second output signal transmitted from the output terminal of the output circuit. The switch circuit switches a connection between the output terminal of the output circuit and the plurality of drivers. The pulse generator generates and transmits at least the following pulse signal after elapse of a predetermined period of time counted from a time when the set pulse signal or the reset pulse signal is transmitted when the voltage level change of the PWM signal. The pulse generator receives the selector signal as the second signal. The received selector signal has a plurality of voltage levels respectively corresponding to the plurality of semiconductor switching elements. The pulse generator changes, on the basis of the state of the received selector signal, the predetermined period of time counted from the time when the set pulse signal or the reset pulse signal is transmitted to a time when the following pulse signal is transmitted at a first time. The detector detects the state of the selector signal based on the predetermined period of time counted from a time when the first input terminal receives the set pulse signal to a time when the first input terminal receives the following pulse signal at a first time, or based on a period of time counted from a time when the second input terminal receives the reset pulse signal to a time when the second input terminal receives the following pulse signal at a first time. The detector instructs, based on a detection result thereof, the switch circuit to connect the output terminal of the output circuit to one of the plurality of drivers so as to drive one of the plurality of semiconductor switching elements.

The drive device is equipped with the signal transmission device having the structure previously described. The drive device transmits the PWM signal to the output circuit, for example a RS flip/flop circuit, and to the detector. The detector instructs the switch circuit so as to transmit the output signal of the output circuit to the driver for driving the semiconductor switching element as a driving target on the basis of the voltage state of the selector signal. Accordingly, the drive device reliably transmits the output signal to the semiconductor switching element as a driving target. In addition, the drive device provides the common circuit structure which generates and transmits a plurality of output signals to a plurality of the drivers arranged corresponding to respective semiconductor switching elements. This makes it possible to suppress the total number of circuit components forming the driver device from increasing, and to reduce the manufacturing cost of the driver device.

While specific embodiments of the present disclosure have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present disclosure which is to be given the full breadth of the following claims and all equivalents thereof.

What is claimed is:

1. A signal transmission device comprising a pulse generator, an output circuit and a detector, wherein
the pulse generator comprises a first output terminal and a second output terminal, the pulse generator receives a first signal which has either a High voltage level or a Low voltage level, the pulse generator generates a set pulse signal based on a voltage level change of the first signal from the High voltage level to the Low voltage level, and transmits the set pulse signal through the first output terminal, and the pulse generator generates a reset pulse signal based on the voltage level change of the first signal from the Low voltage level to the High voltage level and transmits the reset pulse signal through the second output terminal,
the output circuit comprises a first input terminal, a second input terminal and a third output terminal,
the output circuit transmits a first output signal, which corresponds to the High voltage level of the first signal, through the third output terminal when the first input terminal receives the set pulse signal transmitted from the pulse generator, and
the output circuit transmits a second output signal, which corresponds to the Low voltage level of the first signal, through the third output terminal when the second input terminal receives the reset pulse signal transmitted from the pulse generator,
wherein
the pulse generator generates and transmits at least a following pulse signal after elapse of a predetermined period of time counted from a time when the set pulse signal or the reset pulse signal is transmitted when the voltage level of the first signal is changed, and
the pulse generator receives a second signal which has a plurality of voltage levels, and changes, on the basis of the second signal, the predetermined period of time counted from the time when the set pulse signal or the reset pulse signal is transmitted to a time when the following pulse signal is transmitted at a first time, and
the detector detects the state of the second signal based on the predetermined period of time counted from a time when the first input terminal receives the set pulse signal to a time when the first input terminal receives the following pulse signal at a first time, or based on a period of time counted from a time when the second input terminal receives the reset pulse signal to a time when the second input terminal receives the following pulse signal at a first time.

2. The signal transmission device according to claim 1, wherein
the pulse generator generates and transmits a plurality of following pulse signals as the following pulse signal.

3. The signal transmission device according to claim 2, wherein
the pulse generator varies, based on the state of the second signal, the predetermined period of time counted from the time when the set pulse signal or the reset pulse signal is transmitted at a first time to the time when the plurality of following pulse signals are transmitted at a first time, and
the pulse generator generates the plurality of following pulse signals having a constant interval of time regardless of the state of the second signal.

4. The signal transmission device according to claim 2, wherein
the pulse generator generates the plurality of following pulse signals having a different frequency corresponding to each of the voltage levels of the second signal, and varies the predetermined period of time, corresponding to each of the voltage levels of the second signal, counted from the time when the set pulse signal or the reset pulse signal is transmitted at a first time to the time when the plurality of following pulse signals are transmitted at a first time.

5. The signal transmission device according to claim 1, wherein
the pulse generator generates and transmits, within a period of time which is shorter than the predetermined period of time, a plurality of set pulse signals as the set pulse signal or a plurality of reset pulse signals as the reset pulse signal.

6. A drive device to drive a plurality of semiconductor switching elements, the drive device comprising a pulse generator, an output circuit, a detector, a switch circuit, and a plurality of drivers, wherein
the pulse generator comprises a first output terminal and a second output terminal, the pulse generator receives a pulse width modulation signal (PWM signal) which has either a High voltage level or a Low voltage level, the pulse generator generates a set pulse signal based on a voltage level change of the PWM signal from the High voltage level to the Low voltage level, and transmits the set pulse signal through the first output terminal, and the pulse generator generates a reset pulse signal based on the voltage level change of the PWM signal from the Low voltage level to the High voltage level, and transmits the reset pulse signal through the second output terminal,
the output circuit comprises a first input terminal, a second input terminal and a third output terminal, the output circuit transmits a first output signal, which corresponds to the High voltage level of the PWM signal, through the third output terminal when the first input terminal receives the set pulse signal transmitted from the pulse generator, and
the output circuit transmits a second output signal, which corresponds to the Low voltage level of the PWM signal, through the third output terminal when the second input terminal receives the reset pulse signal transmitted from the pulse generator,
the plurality of drivers, arranged respectively corresponding to the plurality of semiconductor switching elements, transmit drive signals to the respective semiconductor elements on the basis of the first output signal and the second output signal transmitted from the output terminal of the output circuit,
the switch circuit switches a connection between the output terminal of the output circuit and the plurality of drivers,
wherein
the pulse generator generates and transmits at least a following pulse signal after elapse of a predetermined period of time counted from a time when the set pulse signal or the reset pulse signal is transmitted when the voltage level of the PWM signal is changed, and the pulse generator receives a selector signal, a state of the selector signal has a plurality of voltage levels corresponding to the plurality of semiconductor switching elements, and changes, on the basis of a state of the selector signal, the predetermined period of time counted from the time when the set pulse signal or the reset pulse signal is transmitted to a time when the following pulse signal is transmitted at a first time, and the detector detects the state of the selector signal based on the predetermined period of time counted from a time when the first input terminal receives the set pulse signal to a time when the first input terminal receives the following pulse signal at a first time, or based on a period of time counted from a time when the second input terminal receives the reset pulse signal to a time when the second input terminal receives the following pulse signal at a first time, and the detector instructs, based on a detection result thereof, the switch circuit to connect the output terminal of the output circuit to one of the plurality of drivers so as to drive one of the plurality of semiconductor switching elements.

7. The drive device according to claim 6, wherein the pulse generator generates and transmits a plurality of following pulse signals as the following pulse signal.

8. The drive device according to claim 7, wherein the pulse generator varies, based on the state of the selector signal, the predetermined period of time counted from the time when the set pulse signal or the reset pulse signal is transmitted at a first time to the time when the plurality of following pulse signals are transmitted at a first time, and the pulse generator generates the plurality of following pulse signals having a constant interval of time regardless of the state of the selector signal.

9. The drive device according to claim 7, wherein the pulse generator generates the plurality of following pulse signals having a different frequency corresponding to each of the voltage levels of the selector signal, and varies the predetermined period of time, corresponding to each of the voltage levels of the selector signal, counted from the time when the set pulse signal or the reset pulse signal is transmitted at a first time to the time when the plurality of following pulse signals are transmitted at a first time.

10. The drive device according to claim 6, wherein the pulse generator generates and transmits, within a period of time which is shorter than the predetermined period of time, a plurality of set pulse signals as the set pulse signal or a plurality of reset pulse signals as the reset pulse signal.

11. The drive device according to claim 6, wherein the drive device drives the plurality of semiconductor switching elements composed of one of Insulated Gate Bipolar Transistors (IGBTs), Silicon Carbide Metal Oxide Field Effect Transistors (SiC MOS FETs) and a combination of the IGBTs and the SiC MOS FETs.

* * * * *